United States Patent [19] [11] 3,999,993
Patel et al. [45] Dec. 28, 1976

[54] METHOD OF RETARDING THE FORMATION OF COMPLEXES IN RARE-EARTH PHOSPHOR CONTAINING PHOTOSENSITIVE DICHROMATE SLURRIES AND AQUEOUS PHOTOSENSITIVE SLURRIES

[75] Inventors: Himanshu M. Patel, Pine City, N.Y.; Robert A. Hotaling, Roanoke, Va.

[73] Assignee: Westinghouse Electric Corporation, Pittsburgh, Pa.

[22] Filed: Feb. 25, 1969

[21] Appl. No.: 802,269

[52] U.S. Cl. .................................. 96/93; 96/36.1; 252/301.36; 313/468; 427/157
[51] Int. Cl.² ........................................ G03C 1/66
[58] Field of Search ................. 96/36.1, 93.75, 36, 96/93; 252/301.3; 117/33.5 R, 33.5 C, 33.5 CM, 33.5 CS, 33.5 CP; 313/92.5 PH, 468; 427/157

[56] References Cited
UNITED STATES PATENTS

| | | | |
|---|---|---|---|
| 2,184,310 | 12/1939 | Meigs et al. | 96/93 X |
| 2,716,061 | 8/1955 | Lupo | 96/93 |
| 2,744,072 | 5/1956 | Meister | 252/301.3 |
| 3,287,151 | 11/1966 | Bishop et al. | 117/33.5 |
| 3,342,594 | 9/1967 | Kaplan | 96/36.1 |
| 3,360,675 | 11/1967 | Mikus et al. | 313/92 |
| 3,440,080 | 4/1969 | Tamura et al. | 117/33.5 |
| 3,461,077 | 8/1969 | Kobayashi et al. | 96/36.1 |
| 3,470,411 | 9/1969 | Ozawa | 313/92 |

OTHER PUBLICATIONS

Kosar, J., "Light-Sensitive Systems," 1965, pp. 78–85.

*Primary Examiner*—Charles L. Bowers, Jr.
*Attorney, Agent, or Firm*—W. G. Sutcliff

[57] ABSTRACT

The invention comprises a method of buffering rare-earth oxide phosphor slurries to control the pH thereof and thereby retard the formation of undesirable complexes.

8 Claims, No Drawings

METHOD OF RETARDING THE FORMATION OF COMPLEXES IN RARE-EARTH PHOSPHOR CONTAINING PHOTOSENSITIVE DICHROMATE SLURRIES AND AQUEOUS PHOTOSENSITIVE SLURRIES

BACKGROUND OF THE INVENTION

Field of the Invention

This invention relates to a method of making phosphor screens for cathode ray tubes. The invention is particularly directed to the so-called slurry-direct photographic process for making mosaic type screens having a systematically arrayed multiplicity of elemental phosphor areas such as dots or stripes. Such screens having three systematic arrays, each of a different color emitting phosphor may be used in apertured shadow mask type cathode ray tubes.

In making phosphor screens by this process, a slurry which comprises phosphor particles, a polymeric binder such as polyvinyl alcohol (PVA), a dichromate photosensitizer such as ammonium dichromate and potassium dichromate, and a suspension medium such as water. A quantity of the slurry is deposited near the center of a cathode ray tube face plate panel and is spread evenly thereover by spinning and tilting the panel according to a selected schedule. After the slurry has been spread over the face plate panel to provide a layer of desired thickness, it is dried. The phosphor coating on the face plate panel is then exposed to a desired pattern, e.g., dots or stripes, of light rays through a suitable apertured mask negative, which may eventually be incorporated as part of the finished cathode ray tube. The exposed layer is then developed by washing it to remove the unexposed phosphor areas, thus leaving the desired array of elemental phosphor areas adhered to the panel. The process is repeated for each of a plurality of desired phosphors, such as red emitting, green emitting and blue emitting to produce the finished screen.

For a detailed description of the photographic process refer to U.S. Pat. No. 3,406,068 issued to H. B. Law, Oct. 15, 1968.

It has been observed that when working with red emitting phosphor of the rare-earth oxide type, e.g., yttrium oxide and gadolinium oxide, that the phosphors are very slightly soluble in water. Due to this solubility a hydrolysis reaction occurs forming complexes of the cation of the rare-earth oxide phosphor and chromate-dichromate anions of the dichromate sensitizer thus producing degradation of the oxide phosphor, a change in body color, and rendering the slurry solution insensitive to radiation excitation. The period of time for which the hydrolysis takes place is dependent in part on the type of phosphor used. The gadolinium oxide exhibits a rapid deterioration whereas the yttrium oxide exhibits hydrolysis over a longer period of time.

SUMMARY

The controlled addition of ammonium hydroxide to react with the dichromate sensitizer and/or the phosphor adjusts the pH of the rare-earth oxide phosphor slurry to substantially prevent the formation of complexes in the slurry.

It is an object of this invention to prevent loss of sensitivity and change in body color of rare-earth oxide phosphor slurries due to hydrolysis.

DESCRIPTION OF THE PREFERRED EMBODIMENT

Analysis of standard red emitting phosphor slurries of the rare-earth oxide type, such as gadolinium oxide and yttrium oxide, after aging for approximately a 24 hour period indicates a hydrolysis reaction in which cations of the rare-earth oxide phosphor material react with free chromate-dichromate anions present in the slurry to form complexes which ultimately destroy the phosphor and render the slurry insensitive to ultraviolet pattern exposure.

The partial solubility of the rare-earth oxide phosphors in water results in the formation of metallic ions according to the reactions:

$$Gd_2O_3 + H_2O \rightarrow Gd^{+++}(OH)_3 + Gd_2O_3 + H_2O \qquad (1a)$$

or $$Y_2O_3 + H_2O \rightarrow Y^{+++}(OH)_3 + Y_2O_3 + H_2O. \qquad (1b)$$

The reaction of the dichromate, such as ammonium dichromate and potassium dichromate, in water forms chromate-dichromate anions according to the reaction:

$$(NH_4)_2Cr_2O_7 + H_2O \rightarrow NH_4OH + Cr_2O_7^{--} + CrO_4^{--} \qquad (2)$$

The formation of complexes in the slurry as a result of the reactions (1) and (2) are as follows:

$$Gd^{+++} + CrO_4^{--} + Cr_2O_7^{--} \rightarrow Gd_2(Cr_2O_7)_3 + Gd_2(CrO_4)_3 \qquad (3a)$$

or $$Y^{+++} + CrO_4^{--} + Cr_2O_7^{--} \rightarrow Y_2(Cr_2O_7)_3 + Y_2(CrO_4)_3. \qquad (3b)$$

The complexes resulting from the reaction (3a) are gadolinium dichromate [$Gd_2(Cr_2O_7)_3$], and gadolinium chromate [$Gd_2(CrO_4)_3$].

The complexes resulting from the reaction (3b) are yttrium dichromate [$Y_2(Cr_2O_7)_3$] and yttrium chromate [$Y_2(CrO_4)_3$].

Test results show that the hydrolysis action is in part a function of the pH of the phosphor solution such that by maintaining the pH of the solution between 9.2 and 9.6 by buffering the solution of hydrolysis reaction can be controlled. The buffering of the solution suppresses the solubility of the rare-earth oxide in water and thereby reduces the release of metallic ions. Furthermore buffering of the sensitizer likewise reduces the hydrolysis reaction by causing a valence change in the dichromate sensitizer thereby tying up the chromate and dichromate ions to convert the dichromate ions into chromate-dichromate complex ions.

It has been observed that the treatment of the phosphor solution and the dichromate sensitizer with the buffering agent ammonium hydroxide provides the necessary control over the pH of both the solution and the sensitizer such that a combination of the solution and the sensitizer results in a slurry which is free from the formation of destructive complexes.

The addition of ammonium hydroxide to the rare-earth oxide phosphor solution suppresses the solubility reaction defined in reaction (1) such that:

$$Gd_2O_3 + NH_4OH + H_2O \rightarrow \text{No reaction} \qquad (4a)$$

$$Y_2O_3 + NH_4OH + H_2O \rightarrow \text{No reaction}. \qquad (4b)$$

The addition of ammonium hydroxide to the dichromate solution suppresses the formation of chromate-dichromate ions of reaction (2) such that:

$$NH_4OH + (NH_4)_2 Cr_2O_7 + H_2O \rightarrow \text{No reaction.} \quad (5)$$

It has been determined experimentally that the controlled addition of ammonium hydroxide to the photosensitizer to establish a pH of approximately 9.0 minimum provides the necessary valence change in the sensitizer while maintaining the capability of sensitizing the polyvinyl alcohol binder.

The addition of a phosphor solution buffered to a pH value in the range of 9.2–9.6 by the addition of ammonium hydroxide to a buffered dichromate sensitizer exhibiting a pH of 9.0 or above results in a complex free phosphor slurry exhibiting a desirable stable pH.

It is apparent from reactions (4) and (5) that the formation of slurry complexes can be controlled by buffering the phosphor, the sensitizer, both the phosphor and the sensitizer separately, or the resultant slurry.

While tests indicate a pH value between 9.0 and 10.0 to be optimum for rare-earth oxide phosphor slurries, a slurry pH as low as 8.5 has produced acceptable results.

An optimum pH value of 9.5 represents what appears to be a practical limit beyond which little, if any, slurry improvement can be realized.

Various modifications may be made within the scope of this invention.

We claim as our invention:

1. An aqueous slurry composition for coating color television picture tubes, comprising a rare earth oxide phosphor selected from the group consisting of gadolinium oxide and yttrium oxide, a polyvinyl alcohol binder, a dichromate sensitizer, and an ammonium hydroxide buffering agent in an amount to prevent the formation of rare earth chromate complexes $n_2(Cr_2O_7)_3$ and $n_2(CrO_4)_3$, where n corresponds to Gd for the selection of gadolinium oxide and n corresponds to Y for the selection of yttrium oxide.

2. An aqueous slurry composition as claimed in claim 1 wherein the ammonium hydroxide buffering agent establishes and maintains the pH of said slurry composition between 8.5 and 10.0.

3. The method for preventing the formation of rare earth chromate complexes in a slurry composition for coating color television picture tubes, comprising, the steps of, preparing the slurry composition including a rare earth oxide phosphor selected from the group consisting of gadolinium oxide and yttrium oxide, a dichromate sensitizer, and a polyvinyl alcohol binder, and adding ammonium hydroxide immediately to said slurry composition to prevent the formation of rare earth chromate complexes formed by reactions between said rare earth oxide phosphor and said dichromate sensitizer.

4. The method as claimed in claim 3 wherein said ammonium hydroxide is added to said slurry composition on preparation of said slurry composition.

5. The method as claimed in claim 3 wherein said addition of ammonium hydroxide immediately establishes a slurry pH between 8.5 and 10.0.

6. A method of preventing hydrolysis of a rare earth oxide host phosphor contained in a slurry of an organic binder sensitized with a dichromate ion which comprises insulating the rare earth oxide host phosphor from acid induced hydrolysis by adjusting the pH of said slurry from about 8.5 to 10 by the addition thereto of ammonium hydroxide.

7. The method of claim 6 wherein said pH is adjusted to be between 9 and 9.5.

8. The method of claim 6 wherein said phosphor host is selected from the group consisting of yttrium oxide, gadolinium oxide and yttrium-gadolium oxide.

* * * * *